US010374322B2

(12) United States Patent
Labonte et al.

(10) Patent No.: US 10,374,322 B2
(45) Date of Patent: Aug. 6, 2019

(54) ANTENNA PACKAGING SOLUTION

(71) Applicant: International Business Machines Corporation, Armonk, NY (US)

(72) Inventors: Jean Labonte, Cowansville (CA); Sylvain Ouimet, St. Hubert (CA)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 15/806,496

(22) Filed: Nov. 8, 2017

(65) Prior Publication Data

US 2019/0140361 A1    May 9, 2019

(51) Int. Cl.

| H01L 21/00 | (2006.01) |
| H01L 23/00 | (2006.01) |
| H01Q 21/00 | (2006.01) |
| H01Q 21/22 | (2006.01) |
| H01Q 1/52 | (2006.01) |
| H01Q 21/06 | (2006.01) |

(Continued)

(52) U.S. Cl.
CPC ..... *H01Q 21/0087* (2013.01); *H01L 21/4885* (2013.01); *H01L 23/49816* (2013.01); *H01Q 1/523* (2013.01); *H01Q 21/065* (2013.01); *H01Q 21/22* (2013.01); *H01L 2223/6677* (2013.01); *H01L 2224/4845* (2013.01)

(58) Field of Classification Search
CPC .. H01Q 21/0087; H01Q 1/523; H01Q 21/065; H01Q 21/22; H01L 21/4885; H01L 23/49816; H01L 2223/6677; H01L 2224/4845
See application file for complete search history.

(56) References Cited

U.S. PATENT DOCUMENTS

| 8,854,277 B2 | 10/2014 | De Graauw |
| 9,293,817 B2 | 3/2016 | Sanford |

(Continued)

OTHER PUBLICATIONS

". High-Efficiency Horn Antenna Using Solder Balls for Seamless Package With Millimeter-Wave 3D Chips", Hu et al., IEEE, Apr. 6-11, 2014, URL: http://ieeexplore.ieee.org/document/6901728/.

*Primary Examiner* — Seahvosh Nikmanesh
(74) *Attorney, Agent, or Firm* — Jeffrey S LaBaw; Steven J Meyers

(57) ABSTRACT

A first and second antenna substrate are included in an advanced antenna package. Each antenna substrate includes a respective array of antenna elements disposed on a respective first surface of the substrate. A plurality of stand-off balls disposed between the first surfaces of first and second antenna substrates are bonded to the first surface of the first antenna substrate. A first sub-plurality of the stand-off balls are placed at positions in a peripheral region of the first and second antenna substrates. A second sub-plurality of the stand-off balls are placed at interior positions between antenna elements of the first and second antenna substrates. A plurality of adhesive pillars are disposed between and bond the first surfaces of first and second antenna substrates at a plurality of discrete selected locations. A first location of the discrete selected locations is in a peripheral region. A second location of the discrete selected locations is at an interior position between antenna elements. A method for fabricating the antenna package is also described.

10 Claims, 10 Drawing Sheets

(51) Int. Cl.
*H01L 23/498* (2006.01)
*H01L 21/48* (2006.01)

(56) References Cited

U.S. PATENT DOCUMENTS

| | | | |
|---|---|---|---|
| 2005/0134507 A1* | 6/2005 | Dishongh | H01L 23/36 343/700 MS |
| 2009/0309210 A1* | 12/2009 | Danno | H01L 21/6835 257/690 |
| 2014/0151860 A1 | 6/2014 | Nakamura | |
| 2016/0013090 A1* | 1/2016 | Arneson | H01L 21/6835 414/225.01 |
| 2016/0049723 A1 | 2/2016 | Baks | |
| 2017/0203479 A1* | 7/2017 | Laurin | B32B 7/12 |

* cited by examiner

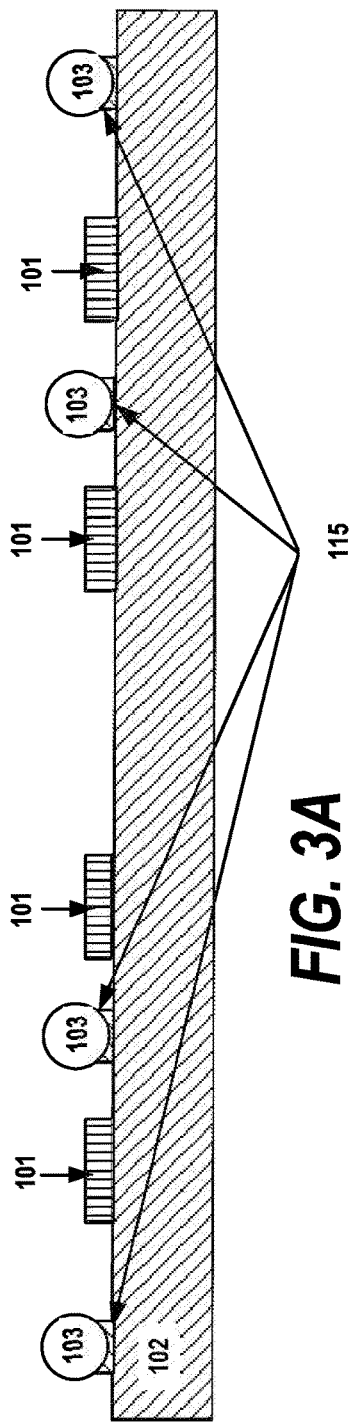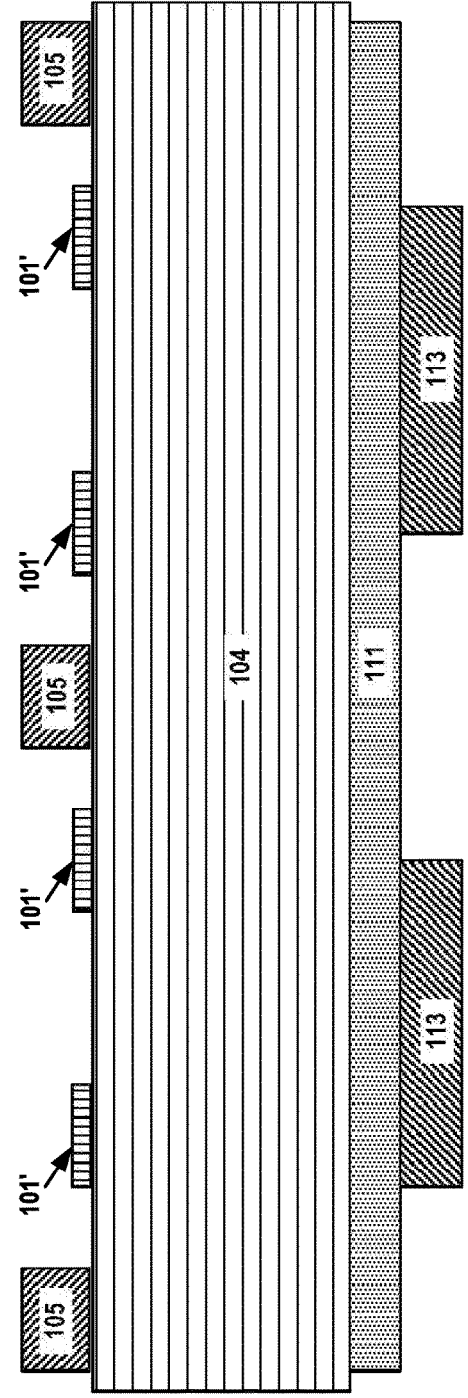

ANTENNA PACKAGING SOLUTION

BACKGROUND OF THE INVENTION

This disclosure relates to integrated circuit devices, and more specifically, to a method and structure to fabricate an advanced, packaged antenna structure for a portable device.

Wireless communication devices require integrated antennas with the appropriate antenna characteristics, e.g., high efficiency, wide bandwidth, good radiation characteristics, and so forth. One challenge is to provide such characteristics while also providing low cost and reliable packaging solutions. Antenna packaging requires the use of high-precision fabrication technologies so that fine antenna features can be implemented in the package structure. Prior art solutions are typically use complex and costly packaging technologies, which are lossy and/or utilize high dielectric constant materials.

For consumer applications, high performance package designs with integrated antennas are not typically required. However, for other applications, e.g., 5G cell tower applications, high performance antenna packages are required and typically involve large phased arrays of antennas. Designing high performance packages with phased array antennas is nontrivial for millimeter wave operating frequencies and higher. Conventional surface-wave suppressing methods in antenna designs cannot be used in phased array antenna packages as the additional structures used for suppressing surface waves occupy too much space, so there is no room to implement them. Moreover, other factors make it difficult to implement and package advanced phased array antenna systems.

The present disclosure presents an advanced packaging approach for high performance antennas.

BRIEF SUMMARY

According to this disclosure, an advanced antenna package is described. A first and second antenna substrate are included in the package. Each antenna substrate includes a respective array of antenna elements disposed on a respective first surface of the substrate. A plurality of stand-off balls disposed between the first surfaces of first and second antenna substrates are bonded to the first surface of the first antenna substrate. A first sub-plurality of the stand-off balls are placed at positions in a peripheral region of the first and second antenna substrates. A second sub-plurality of the stand-off balls are placed at interior positions between antenna elements of the first and second antenna substrates. A plurality of adhesive pillars are disposed between and bond the first surfaces of first and second antenna substrates at a plurality of discrete selected locations. A first location of the discrete selected locations is in a peripheral region. A second location of the discrete selected locations is at an interior position between antenna elements. In embodiments of the invention, the plurality of stand-off balls and the plurality of adhesive pillars control an air gap between the first and second antenna substrates. A method for fabricating the antenna package is also described.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which:

FIGS. 3A and 3B are respectively cross-sectional drawings of an antenna lid substrate and an antenna carrier substrate after solder ball join and adhesive pillar formation according to a first embodiment of the invention;

DETAILED DESCRIPTION OF THE DRAWINGS

At a high level, embodiments of the invention include a pair of antenna elements disposed on planar substrates separated by copper ball stand-offs and localized adhesive pillars in an antenna package. The combination of copper ball stand-offs and localized adhesive pillars cooperate to control the antenna and substrate planes to a specific spacing requirement. In preferred embodiments, at least one of the antenna substrates is a laminate structure, e.g., made of materials used for a printed circuit board. In preferred embodiments, individual ones of the copper ball stand-offs and localized adhesive pillars are attached at the periphery of the laminate substrate and between antenna elements within the antenna array. In some preferred embodiments, combined copper ball stand-off/adhesive pillar structures are formed at specific locations at the substrate periphery or between antenna elements within the antenna array. In preferred embodiments, the choice of whether to place a copper stand-off or an adhesive pillar is made according to whether a compressive or tensile stress is expected at particular locations in the substrate. Because of the compact size of the copper stand-offs and/or adhesive pillars, they can be placed within an antenna array design without the need to dedicate a portion of the package for joining. Packaging curing with pressure applied on both substrates is performed to assure mechanical stability of the package as well as to achieve the specified gap between the antenna planes in the package. Embodiments of the invention will be explained below with reference to the accompanying drawings.

In a class of antenna structures which can be fabricated according to the illustrated embodiments, the two layers of antenna patterns are produced on respective substrates and retained at a very tight, uniform and controlled distance with respect to each other. Further, the packaging of the two antenna layers must have sufficient mechanical stability during the package lifetime to assure correct performance and reliability. As the dimensions of the antenna and antenna elements decrease in size, packaging the antenna layers becomes more challenging and prior art solutions require too much area from each substrate area for packaging the two substrates together.

In embodiments of the invention, the two layers of antenna elements are respectively patterned on each of two laminate substrates which are assembled one over the other in a way that antennas' arrays are facing each other. The antenna arrays are aligned with a controlled air gap between both the laminate top planes and the antenna layer planes disposed over the respective laminate surfaces.

The packaging solution described herein will assure stable distance and mechanical stability between two antenna layers.

Figure 1:
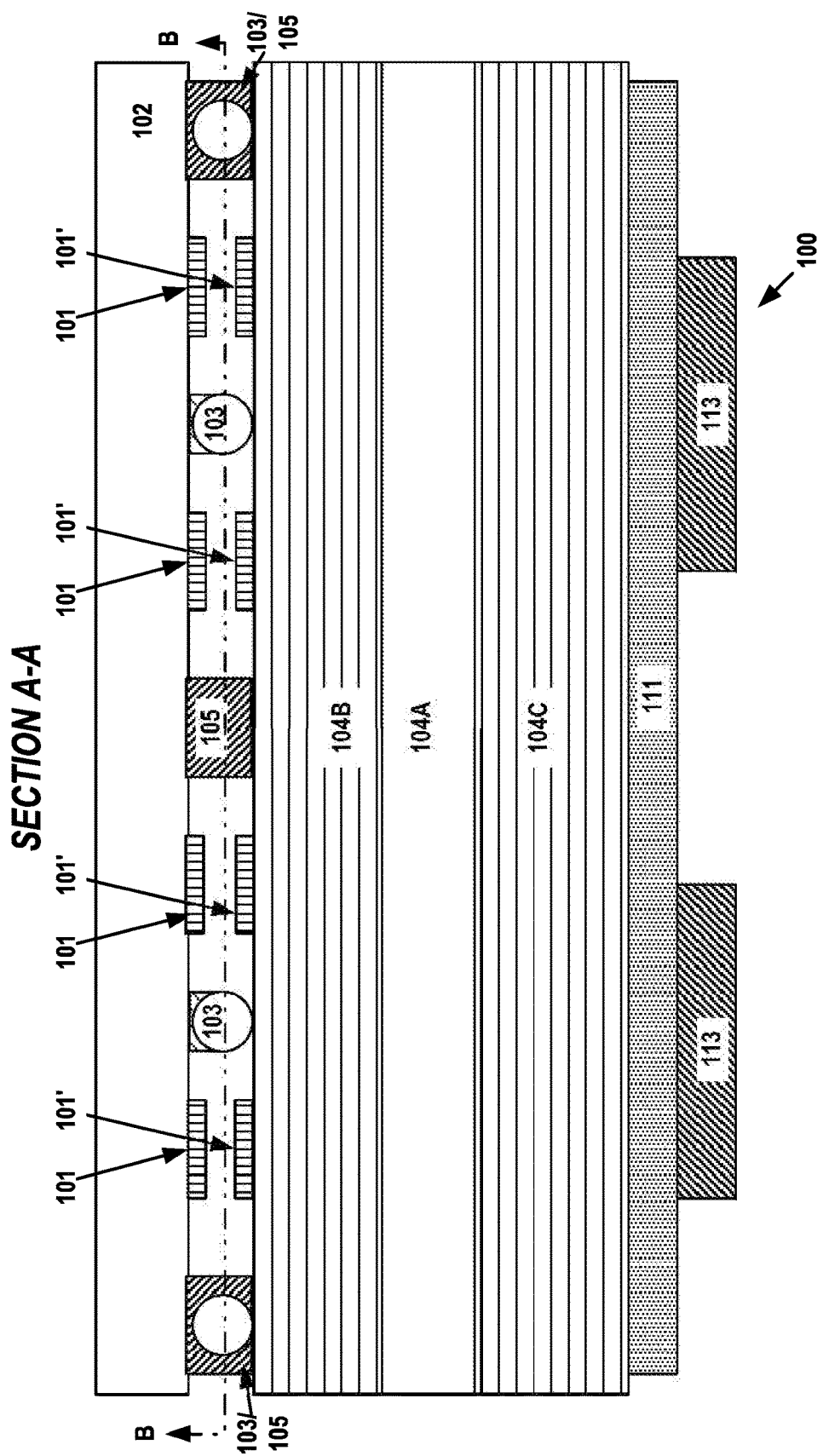
FIG. 1 is a cross-sectional drawing of a completed antenna structure according to a first embodiment of the invention.

FIG. 1 is a cross-sectional drawing of a completed antenna structure according to a first embodiment of the invention. A preferred antenna design includes two sets of patterned antenna elements 101, 101' each fabricated in a respective antenna layer on a respective substrate 102, 104. In one 5G packaging solution, antenna elements 101 which are disposed on the surface of laminate carrier 102 are an 8×8 array of patch antenna elements which radiate and/or receive electromagnetic signals while the antenna elements 101' disposed on the surface of substrate 104 are ground plane elements. In other embodiments of the invention, this can be reversed or other types of antenna elements can be patterned. Further, different numbers of antenna elements in the horizontal direction as compared to the number of antenna elements in the vertical direction are used in alternative embodiments. As depicted in the illustration, the antenna elements 101, 101' are symmetric and line up with each other. However, in other embodiments, the two patterns of antenna elements are different and do not line up with each other. In one preferred embodiment wherein the placement of antenna elements is symmetric between substrates, there is a +/−120 to 150 μm tolerance for antenna alignment between respective antenna planes in an XY direction. The laminate substrate 102 is referred to as the package lid or package cover at times in this description. The laminate substrate 104 is referred to as the main package substrate or antenna carrier at times in this description.

The antenna elements 101, 101' in the two antenna layers are held at a constant pitch with respect to each other and maintained at controlled distance by the copper ball stand-offs 103 and adhesive pillars 105 disposed at selected locations in the package 100. In some preferred embodiments, combination stand-off/pillars 103/105 are disposed at selected locations. The combination stand-off/pillars 103/105 are shown in the figure at the two outside positions, however, in alternative embodiments, they may be located at interior positions of the antenna patterns as well.

The air cavity between the two substrates provides a low dielectric constant between the two substrates 102, 104. The spacing between the ground plane elements 101' and the patch antenna elements 101 will depend on the height of the air cavity and the thicknesses of the metallization of the ground plane elements 101' and the patch antenna elements 101. In one embodiment of the invention, the height of the air cavity is about 400 microns. In empirical tests, two prototypes were successfully built using 381 μm and 762 μm copper balls. More generally, the inventors believe the inventive technique has application in antenna designs with an air gap in a range of about 50 microns to about 1000 microns. The specific air gap will depend on the operating frequency and other factors.

The laminate substrates 102, 104 in one embodiment are preferably similar to printed circuit boards in construction. The metal line layers and vertical connections between metal line layers which serve as antenna feed lines are not shown for ease in illustration. The top substrate 102 (alternatively called the package cover or package lid) is simpler in terms of the internal metal lines and connectors than the antenna carrier 104. In one embodiment of the invention, the package lid 102 has a single layer of metallization on one or both sides, but no internal metallurgy. In other embodiments, there are vertical lines between metal lines or elements on either side of the package lid 102, but no intermediate metal line layers.

On one side of the antenna carrier 104 is disposed the antenna array comprised of the antenna ground elements 101'. A plurality of devices 113, e.g., semiconductor chip devices, are bonded on the other side of the antenna carrier 104 by means of a flip-chip bonding process or other conventional joint connection process. For ease in illustration, the solder bumps connecting the RFIC chips 113 to the antenna carrier 104 are not depicted. The devices 113 may be radio frequency integrated circuit (RFIC) chips. The RFIC chips are connected to the antenna ground elements 101' by means of antenna feed lines (not pictured) which receive and provide electromagnetic energy to and from the antenna elements 101. In embodiments of the invention, where multiple RFIC chips are used, each of the RFIC chips control or receive signals from different sets of antenna elements 101, 101'.

In a preferred embodiment, the antenna carrier 104 is comprised of a central "core" layer 104A which provides a structurally strong layer for an antenna layer 104B and a RFIC chip interface layer 104C. The core layer 104A is composed of standard printed circuit board (PCB) material. In this embodiment, antenna lid 102 is structurally similar to the core layer 104A, i.e. also composed of PCB material. The core layer 104A has a ground plane on either side and vertical lines so that the antenna layer 104B and RFIC chip interface layer 104C electrically interconnect. The antenna layer 104B contains antenna feed lines (not pictured) which couple electromagnetic energy to and from the patch antenna elements 101 on the antenna lid 102. The antenna layer 104B may also contain ground planes (not pictured) to shield the RFIC chips from electromagnetic radiation captured by the patch antenna elements 101. The RFIC chip interface layer 104C contains a power plane, one or more ground planes and signal lines for the RFIC chips 113 to communicate with each other as well as the patch antenna elements 101. The antenna layer 104B and RFIC chip interface layer 104C comprise a plurality of laminated layers, where each layer includes a metal pattern on an insulating layer.

In other embodiments of the invention, other substrates can be used to support the antenna elements such as a ceramic substrate or another substrate amenable to the particular application. Further, a first substrate material can be used for the package lid 102 and a second substrate material for the antenna carrier 104.

In structures as described above, where different structures have different coefficients of thermal expansion during the curing process, the invention has particular applicability. Because, for example, the two separate laminate substrates 102, 104 have different thermal characteristics than the RFIC chips 113, e.g., coefficients of thermal expansion, compressive and tensile forces develop before, during and after the curing process. Further, as the package itself is bonded to other structures, the package and those structures typically have different thermal characteristics which induce additional stresses. To keep the two antenna layers at a constant pitch with respect to each other, the package structure needs to assure mechanical stability as well as very precise placement for antenna layer alignment both during and after the packaging process.

The prior packaging solution used bonding located at the antenna layer peripheries where there are no antenna conductors. This prior solution required a larger package than desired since extra area at the periphery of and outside the antenna conductor area was needed for mechanical stability and gap control.

The present invention accounts for the compressive and tensile forces while allowing for a more compact packaging solution. A combination of copper ball stand-offs and adhesive pillars are precisely positioned between antenna elements to assure air gap control as well as mechanical stability of the packaging solution. The present solution allows an optimal antenna configuration without requiring specific places for the stand-offs and pillars to be designed into the antenna array. The stand-offs and pillars are sized to fit between the antenna elements, providing sufficient mechanical stability while at the same time being sized so that no solder or adhesive contacts the antenna element surface.

Figure 2:
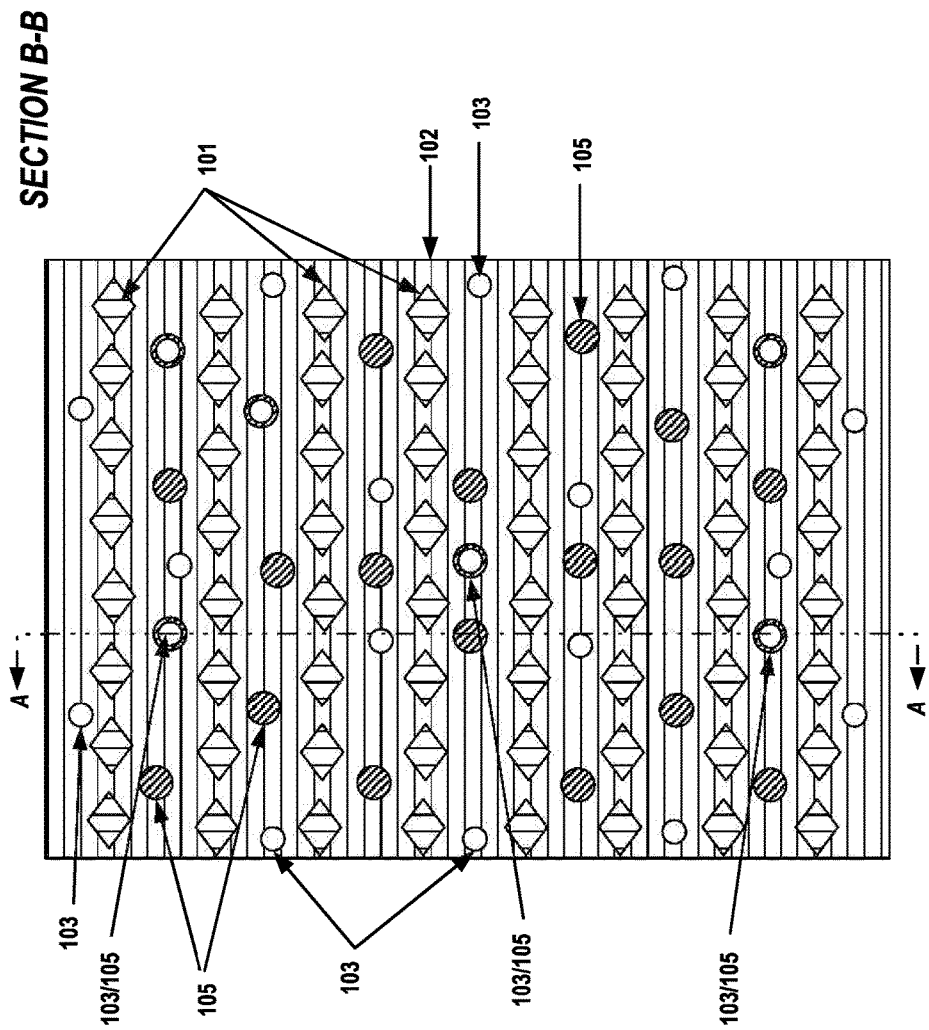
FIG. 2 is a top view of an antenna layer according to a first embodiment of the invention.

FIG. 2 is a top view of an antenna layer according to a first embodiment of the invention. This view shows the pattern of the antenna lid 102, the pattern on the antenna carrier (not pictured) would be similar in some embodiments. As shown, the antenna patch elements 101 have a diamond shape and are positioned in an 8×8 array. The antenna patch elements measure 2 mm×2 mm in this embodiment and are spaced 7 mm in the vertical direction and 5 mm in the horizontal direction. Other embodiments have other arrangements of patch elements and spacing between patch elements. The antenna patch elements can be different shapes, e.g., squares or rectangles. As can be seen in the drawing, copper ball standoffs 103, adhesive pillars 105 and combination copper ball stand-off/adhesive pillars 103/105 are distributed over the carrier substrate surface 104. In preferred embodiments of the invention, the copper ball stand-offs are used in places where a compressive force is expected and an adhesive pillar is used where a tensile force is expected. A combination stand-off/pillar is preferably used where both compressive and tensile forces are expected. The tensile and compressive forces may occur at different times at a particular location, e.g., a compressive force when the antenna lid 102 and antenna carrier 104 are clamped during the adhesive curing process and a tensile force after curing, e.g., when the antenna package is in use.

In the illustrative embodiment, an adhesive dot diameter from 2.0 to 2.5 mm is preferred and a copper ball stand-off diameter of 300 to 800 µm is preferred. However, other dimensions for different antenna packages with different spacing between antenna patch elements or antenna planes are considered in scope for the invention. The pillar and stand-off diameter is selected to be smaller than the pitch between the antenna elements in the antenna array so that the pillar or stand-off can be placed without affecting the regular spacing of the antenna elements in the array. The adhesive dot diameter is chosen so that the cured adhesive pillars will have sufficient strength to overcome the tensile forces and maintain antenna package integrity. Also, it is undesirable for the adhesive pillar to contact the antenna elements as the contact will create effects such as interference with the antenna. The diameter of the copper ball is chosen according to the air gap desired between the antenna planes accounting for the height of the solder connection(s) and the height of the antenna elements. Further, the number of stand-offs and adhesive pillars are selected to satisfy the mechanical stability requirements of the package while minimizing the number of stand-offs and pillars to reduce material costs and interference with the antenna.

FIGS. 3A and 3B are respectively cross-sectional drawings of an antenna lid substrate 102 and an antenna carrier substrate 104 after solder ball join and adhesive pillar formation according to a first embodiment of the invention. In these figures, and in later figures, for ease in illustration, the depiction of the antenna carrier 104 is simplified.

The copper ball stand-offs and adhesive pillars are respectively formed on one of the substrates, e.g., either the antenna lid 102 or the antenna carrier 104. In alternative embodiments, the stand-offs and pillars are formed on both substrates or on one substrate. As shown in the drawings, the copper ball stand-offs 103 are shown initially connected to the antenna lid substrate 102 and the adhesive dots 105 are shown deposited on the antenna carrier substrate 104. However, other embodiments of the invention have both copper ball stand-offs and adhesive dots initially formed on one of the substrate. Yet other embodiments of the invention have one set of stand-offs and adhesive dots formed on the antenna lid and a second set of adhesive dots formed on the antenna carrier. The preferred process flow shows the copper balls on the laminate lid. The advantage in having the copper balls on the antenna lid and the adhesive dots on the antenna carrier is that each substrate only sees a single reflow for the copper ball attachment. The antenna carrier already sees a reflow process to attach the RFIC chips to the carrier. If the copper stand-offs are placed on the antenna carrier, it will see two reflows, one for the RFIC chip attach process and one for the copper ball attach process. It is a good practice to minimize the number of reflows in a bonding process.

Solder paste 115 is screened onto the antenna lid substrate 102 and the copper ball stand-offs 103 are placed on the applied solder paste 115. The solder paste 115 could be applied to a single substrate as shown or could be applied to both substrates in other embodiments. The primary function of the copper balls is to assure controlled gap control at defined locations and deal with compressive forces during the packaging process. However, in embodiments that the solder balls are attached to both substrates, they can also help with the tensile forces after curing.

Controlled adhesive pillars 105 are added at specific locations between antenna elements 101' to deal with tensile forces and mechanically maintain the spacing between the antenna planes. In embodiments where the copper ball stand-offs are joined only to one substrate, the adhesive pillars will be the means by which the two substrates remain joined after the curing process. In embodiments that the copper ball stand-offs are joined to both substrates, the solder joints on both substrates can assist the adhesive pillars with tensile forces that exist after the curing process.

As shown, an adhesive dot can be added at a copper ball location on the opposing substrate to form a combined stand-off/adhesive pillar structure or can be placed at different locations from the copper ball stand-offs for mechanical stability, e.g., at locations where tensile forces are expected because of the package geometry and component properties. In the drawings, the peripheral copper ball stand-offs and adhesive pillars will form the combined structures.

The constant air gap between the substrates is achieved by locating an adequate number of copper ball locations positioned where compressive forces are present between the substrates and an adequate number of adhesive pillars located where tensile forces are present between substrates. The compressive and tensile forces are present during force capping process and the curing process. In some embodiments, the tensile and compressive forces are also present after the package is fully cured. After curing, there also needs to be an adequate number of joints to hold the package together at the constant air gap.

As shown in FIG. 3A, solder paste 115 is screened on selected solder pads (not pictured) on the antenna lid 102, i.e. on the antenna side of the substrate where antennas elements 101 are formed. The solder pads could be located on the periphery and/or between antennas elements in the interior of the antenna lid 102 depending on the location of the anticipated compressive forces and locations needed to maintain the desired gap between substrates and antenna planes. Next, the copper balls 103 are placed over the solder paste. The antenna lid 102 is subjected to a solder reflow process to firmly attach the solder balls to the solder pads. A cleaning process is used to remove flux residue left on the package. While preferred embodiments of the invention use copper balls as the preferred stand-off, other materials, including metals and dielectrics can be used. Copper balls are preferred because they are widely used in semiconductor packaging processes. The quality control and supply of copper balls of a nearly uniform diameter exists. The solder bonding process is also well understood. Other metallurgy such as tin and gold can be used in the stand-offs. However, dielectrics such as glass beads can be used in alternative embodiments. A dielectric can have preferred electrical properties as they will create less interference with the antenna array.

The number of copper ball stand-offs is preferably minimized in designs to minimize the material requirements and to avoid possible interference. In prototype builds, the interference caused by the copper has not proved to be a significant problem, given that the number of stand-offs and pillars were sufficient to maintain structural integrity. However, where the antenna must be particularly sensitive, dielectric stand-offs may be preferred. Other embodiments where dielectric stand-offs are preferred include where many stand-offs are required, e.g., the substrates need to be straightened during the capping process (explained below), or where many individual locations where compressive forces are expected between the two substrates. Rather than using solder to join the dielectric balls, alternatives like the adhesive used to form the adhesive pillars are used to bond the glass beads to a substrate in alternative embodiments. Using adhesives to mount the glass bead stand-offs to the substrate surface will allow a lower temperature profile to be used in the process.

As shown in FIG. 3B, the adhesive is dispensed at precise locations, particularly between the antenna elements. Empirical results indicate that the diameter of the adhesive dots should be controlled. In embodiments with a pitch of around 5 to 7 mm between antenna elements, multiple adhesive dots between 2.0 to 2.5 mm in diameter provide the needed structural strength and avoids spread of the adhesive over any of the antenna elements close to the adhesive dot. Where the pitch between antenna elements becomes smaller, the diameter of the adhesive dots may also need to be reduced to avoid contact with the antenna element. Contacting the antenna elements by the adhesive is undesirable because of the interference with the antenna signal which this would create. A preferred adhesive is epoxy based. The preferred adhesive properties would include high thixotropic index, high modulus, low elongation and high adhesion properties for best package mechanical performance and stability.

Figure 4:
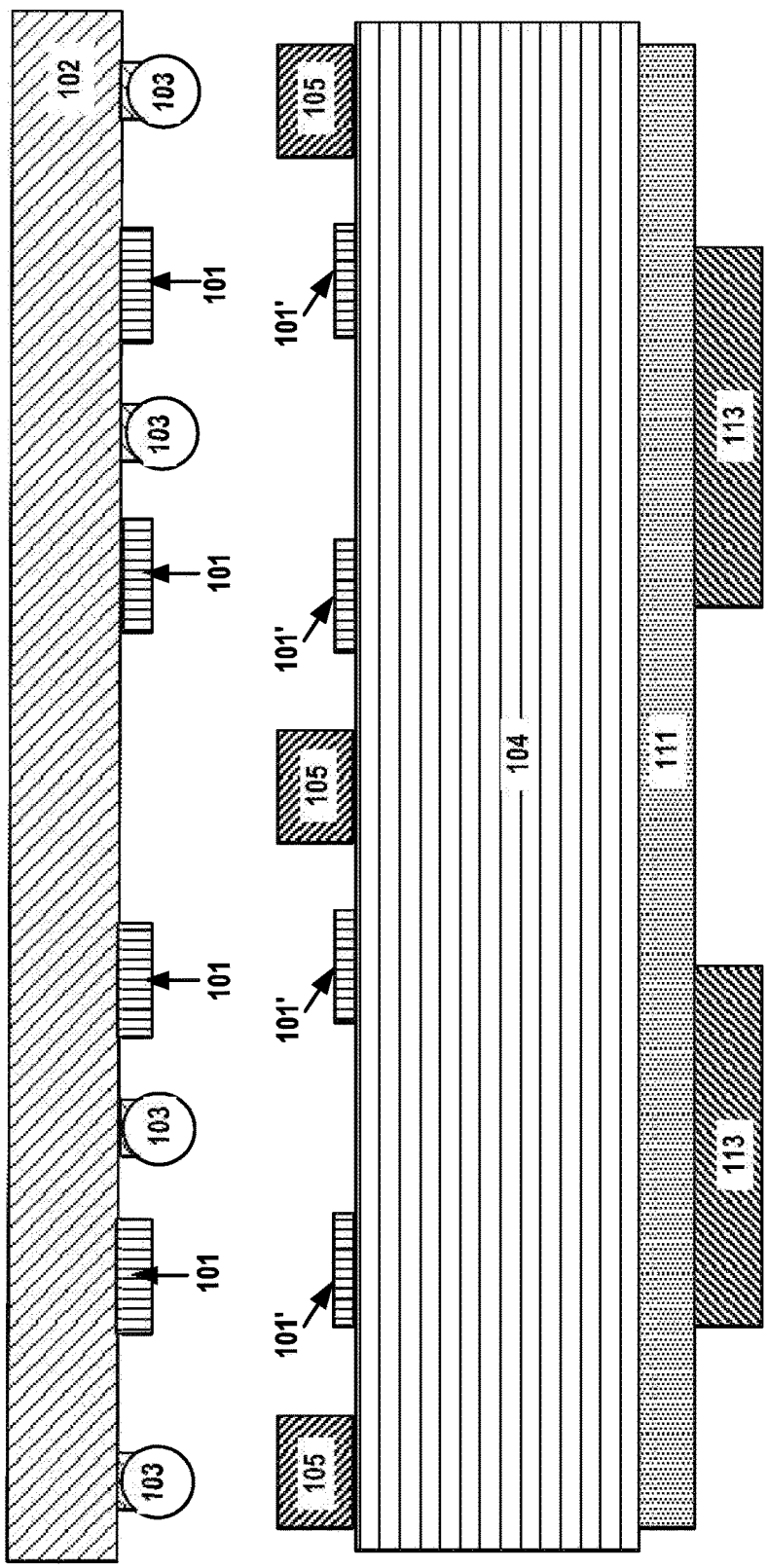
FIG. 4 is a cross-sectional diagram of the antenna lid substrate and the antenna carrier substrate brought into alignment according to a first embodiment of the invention.

FIG. 4 is a cross-sectional diagram of the antenna lid substrate 102 and the antenna carrier substrate 104 brought into alignment according to a first embodiment of the invention. In the drawing, the antenna lid 102 with the attached copper ball stand-offs 103 is flipped over and aligned with the antenna carrier substrate which has the adhesive dispensed dots 105. Note that the peripheral stand-offs 103 and pillars 105 are located in a similar position on their respective substrates so that when the lid 102 and carrier 104 are brought together, they will form combined stand-off/pillar structures.

Next, a force capping process which includes adhesive curing will take place. In one embodiment of the invention, the aligned antenna lid 102 and antenna carrier 104 are placed in a fixture adapted to hold the substrates. Then, a clamp engages the antenna lid so that the lid and carrier are brought together at the desired air gap. The clamp has a member which is adapted to provide a secure, uniform pressure on the lid. The fixture with the clamp engaged and locked is then placed in a curing oven at temperature The force required for the clamp depends on may factors such as the configuration of the fixtures and the substrates, the number of copper balls placed and to a lesser extent the number of adhesive dots. An adequate force needs to be selected to assure good contact to laminate while avoiding any damage to the top layers of the laminate. As the adhesive curing process takes place at an elevated temperature, and the coefficient of thermal expansion for different components of the package differ, compressive and tensile stresses occur. The invention compensates for these stresses by the placement of the respective stand-offs, pillars and composite structures. During the cure process in the furnace, a laminate substrate becomes more compliant which can reduce the forces experienced by the substrates. However, as the antenna package cools, the tensile forces can increase and be present in new places because of the presence of the stand-offs as they maintain the air gap distance.

Figure 5:
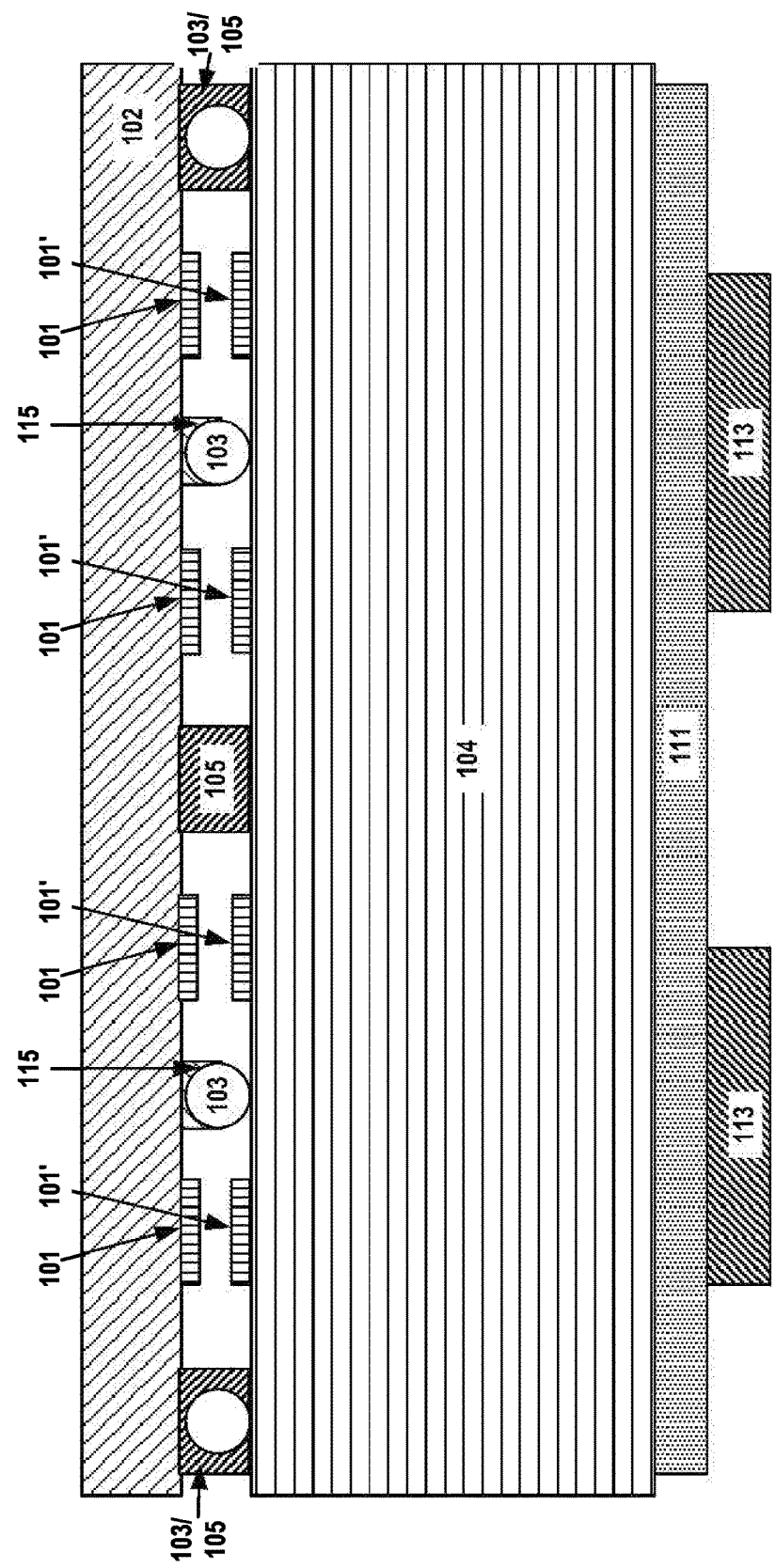
FIG. 5 is a cross-sectional drawing of a completed antenna structure according to a first embodiment of the invention.

FIG. 5 is a cross-sectional drawing of a completed antenna structure according to a first embodiment of the invention. As shown, antenna lid 102 and antenna carrier 104 are bonded together with a plurality of adhesive pillars. At least some of the adhesive pillars 105 are located where tensile forces are expected, at least some of the copper ball stand-offs 103 are located where compressive forces are expected, while the composite structures 103/105 are located where compressive and tensile forces are expected. The compressive and tensile forces may be expected during the capping process, the curing process or once the package is complete.

Figure 6:
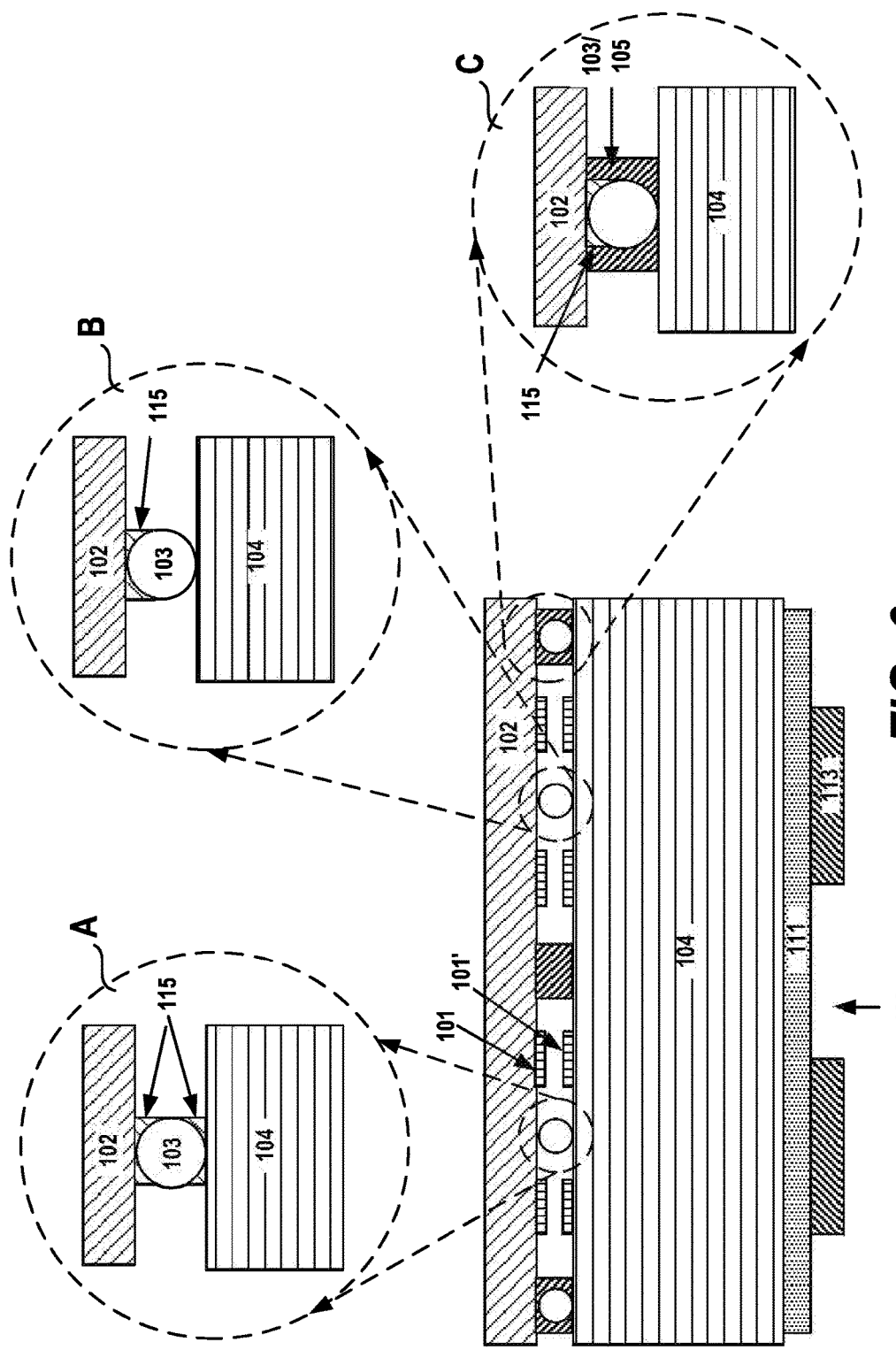
FIG. 6 is a cross-sectional drawing of a completed antenna structure according to a first embodiment of the invention showing enlarged sections respectively of a combined copper ball stand-off/adhesive pillar structure and a copper ball stand-off.

FIG. 6 is a cross-sectional drawing of a completed antenna structure according to a first embodiment of the invention showing enlarged sections of different attachment mechanisms for a combined copper ball-adhesive pillar and copper ball stand-offs. A first copper ball stand-off 103 is shown soldered to both the antenna lid 102 and the antenna carrier 104 in enlarged area A in the drawing. A second copper ball stand-off 103 is shown soldered only to the antenna lid in enlarged area B. This embodiment shows that respective stand-offs may be soldered to one or both substrates. In enlarged area C, a copper ball stand-off/adhesive pillar 103/105 is depicted. The copper ball component is attached by means of adhesive to both the antenna lid 102 and antenna carrier 104. The copper ball stand-off is also attached to the antenna lid 102 by means of a solder joint 115. In some embodiments, it is preferred that the diameter of the adhesive pillar exceed that of the copper ball so that the adhesive surrounds the ball on all sides. In yet another embodiment, the solder ball or dielectric bead can be attached with adhesive on both sides (not pictured).

Figure 7A:
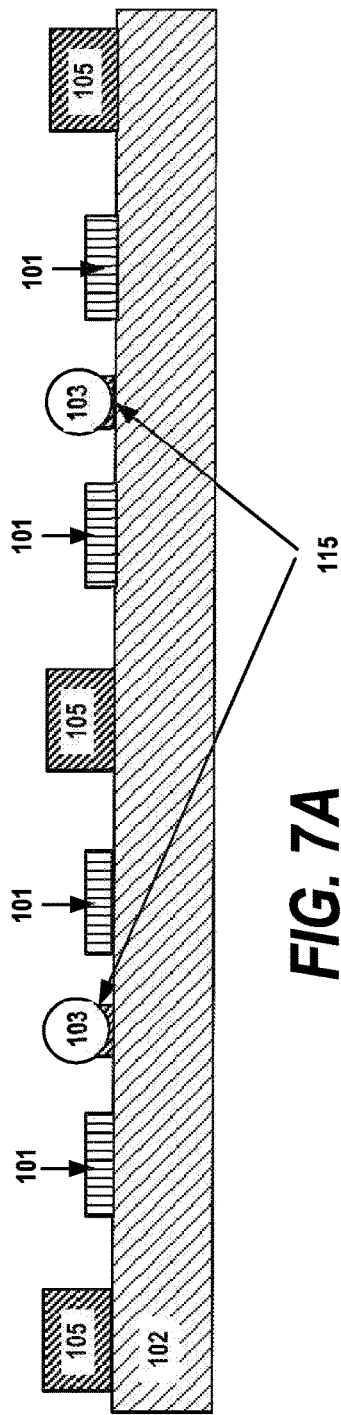
FIGS. 7A and 7B are cross-section diagrams of the antenna lid and antenna carrier in a second embodiment of the invention.
Figure 7B:
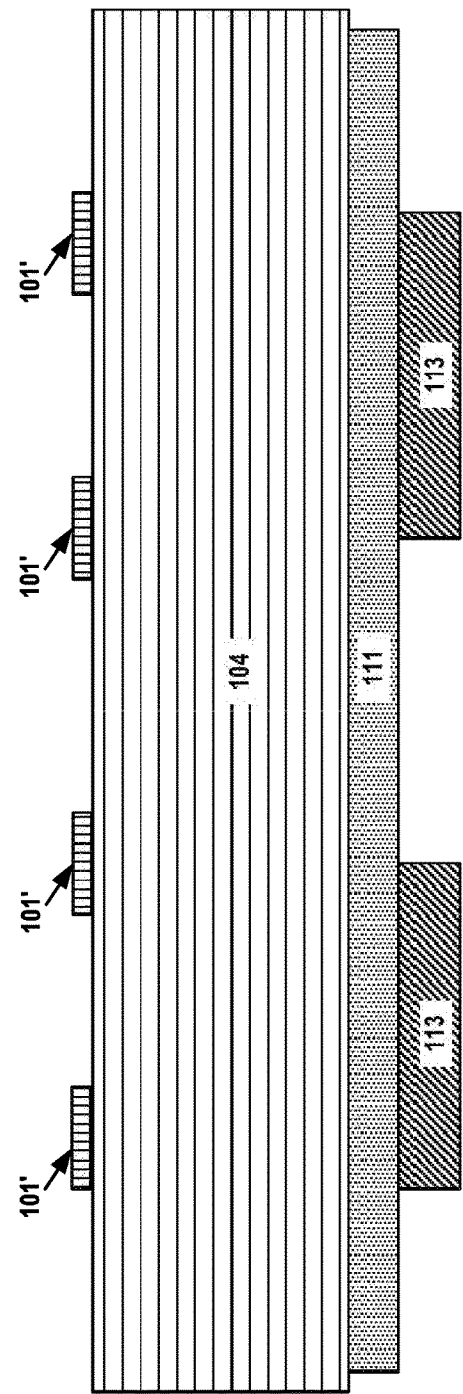

FIGS. 7A and 7B depict another embodiment of the invention where both the copper ball stand-offs 103 and the adhesive pillars 105 are deposited on a single substrate, in this case the antenna lid 102. In other embodiments, the stand-offs and pillars can be deposited on the antenna carrier 104. In other embodiments, the stand-offs and pillars are deposited on one substrate and in those locations that the composite structures are desired, stand-offs are deposited.

In empirical testing, in one prototype, nickel plated copper balls with nominal dimensions of 762 μm were used for the copper ball standoffs. The height measurements from the ball top to the top of the solder resist averaged 773 μm with a standard deviation of 16 μm. In the empirical tests for a packaging solution for two antenna arrays each containing an 8×8 array of antenna elements, results suggested that 17 copper ball stand-offs and 24 to 30 adhesive pillars created adequate structural integrity given a 5-7 mm spacing between antenna elements. An increased number of adhesive pillars and stand-offs can be accommodated in terms of the number of available spaces between antenna elements for placement, and could increase the structural integrity, but at the cost of creating interference in the antennas. One skilled in the art would appreciate that other antenna package designs will require different numbers of stand-offs and adhesive pillars.

The composite structures need to be placed more carefully than the stand-offs or the adhesive dots, since the volume of the ball and the solder joint tends to make the adhesive pillar expand in diameter. The advantage in having a mixture of stand-off and pillars is that they can be controlled individually better than a package consisting purely of the composite structures. The stand-offs are believed to better control the air gap spacing than the composite structures where an additional force is required to move the adhesive between the stand-offs and the substrate on which the adhesive dots are initially deposited. The advantage of the composite structures is that both compressive and tensile forces are controlled in a single structure and reduces the total number of structures required for structural stability.

While the optimal diameter of the adhesive pillar will depend on the design of the antenna array, for antenna array having a pitch of 6-8 mm between antenna elements, a nominal adhesive diameter of 2 to 2.2 mm is preferred in embodiments of the invention. With an antenna element pitch of 5-7 mm, adhesive diameter dots of 2.5 mm also worked well; 3.0 mm diameter adhesive dots and above are not recommended because of an increased possibility of contacting antenna elements and creating interference. Smaller adhesive dots can be used, but a smaller diameter dot will reduce the structural integrity of the created adhesive pillar and will require additional dots/pillars in a given antenna package design. In empirical results, the adhesive pillars created were well controlled. For an applied nominal diameter of 2 mm for the adhesive dot, the average adhesive pillar created after cure was 2.128 mm with a standard deviation of 0.029 mm. The substrate to substrate (laminate to laminate) gap was also well controlled; for a 802 micron air gap, a standard deviation within 20 microns was measured on the periphery.

Figure 8:
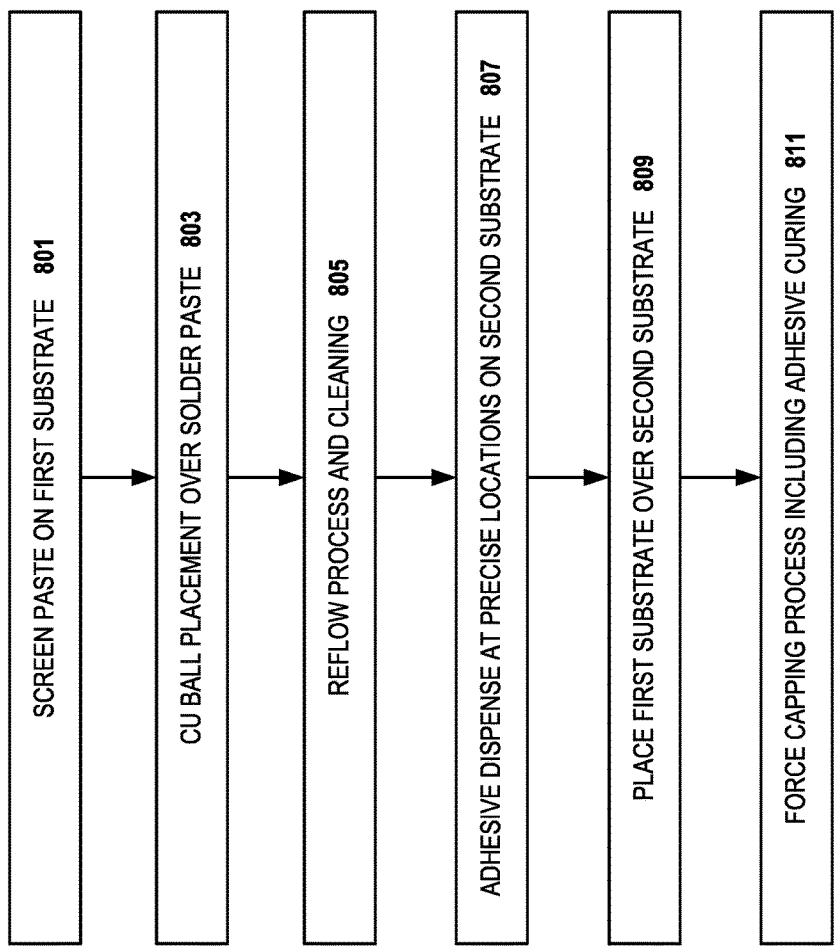
FIG. 8 is a flow diagram of one embodiment of the invention.

A flow diagram of the process is shown in FIG. 8. In step 801, the solder paste is applied to the selected locations on the first substrate. The copper balls are placed on the solder paste locations in step 803. The solder reflow and cleaning process is performed in step 805. In parallel, the adhesive dots are dispensed at precise locations on the second substrate, step 807. In step 809, the first substrate is placed and aligned over the second substrate so that the locations of the stand-offs and adhesive dots are aligned correctly as well as the antenna elements between the substrates. The force capping process, including the adhesive curing, is performed in step 811.

In other embodiments, the process will differ slightly, for example, the adhesive dots and copper ball stand-offs are applied to the same substrate in other embodiments of the invention. In those embodiments, it is preferred to apply the stand-offs first as the adhesive cure is a lower temperature than the solder reflow.

Figure 9:
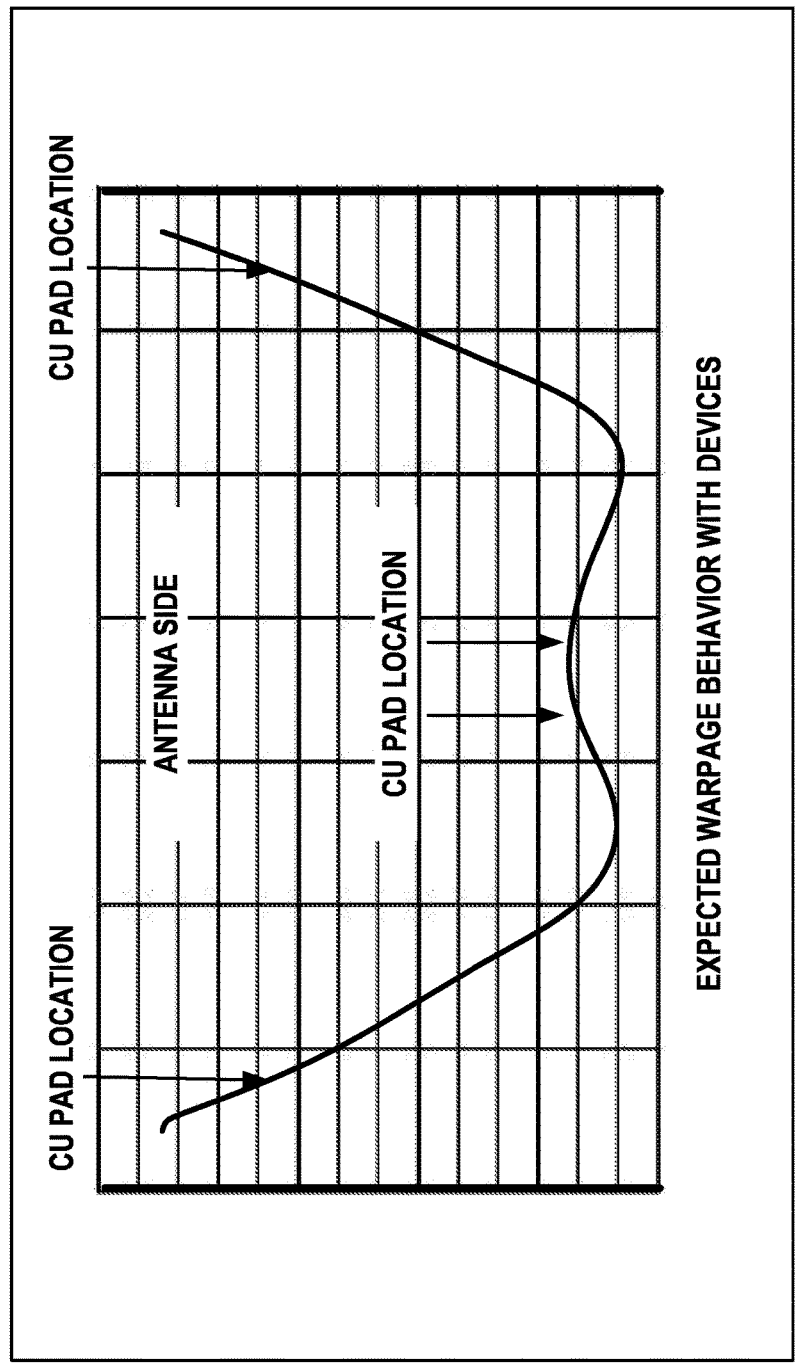
FIG. 9 is a diagram showing anticipated warpage of the antenna carrier with die attached on back side and placement proposal of copper stand-offs in one preferred embodiment.

Embodiments of the invention determine where the compressive and tensile forces will occur according to modeling of the substrates and the attached components. By knowing how the attached RFIC chips stress the laminate packaging, the stresses can be predicted for each design. Another way to predict the compressive and tensile forces is empirically by measuring the actual warpage of the substrates after components like the RFIC chips are attached to the antenna carrier but before the two substrates are joined. As shown in FIG. 9, where RFIC chips are joined in a central region, the edges of the top surface of the antenna carrier tend to curl up. That is, the central region is lower with a small bump upwards in the central region. Thus, with this profile, one can expect compressive forces at the periphery and the small bump region of the substrate and tensile forces at the central region (just outside the small bump region) of the substrate. As shown in the figure, copper stand-offs are needed in both the edge regions and the small bump region.

Figure 10:
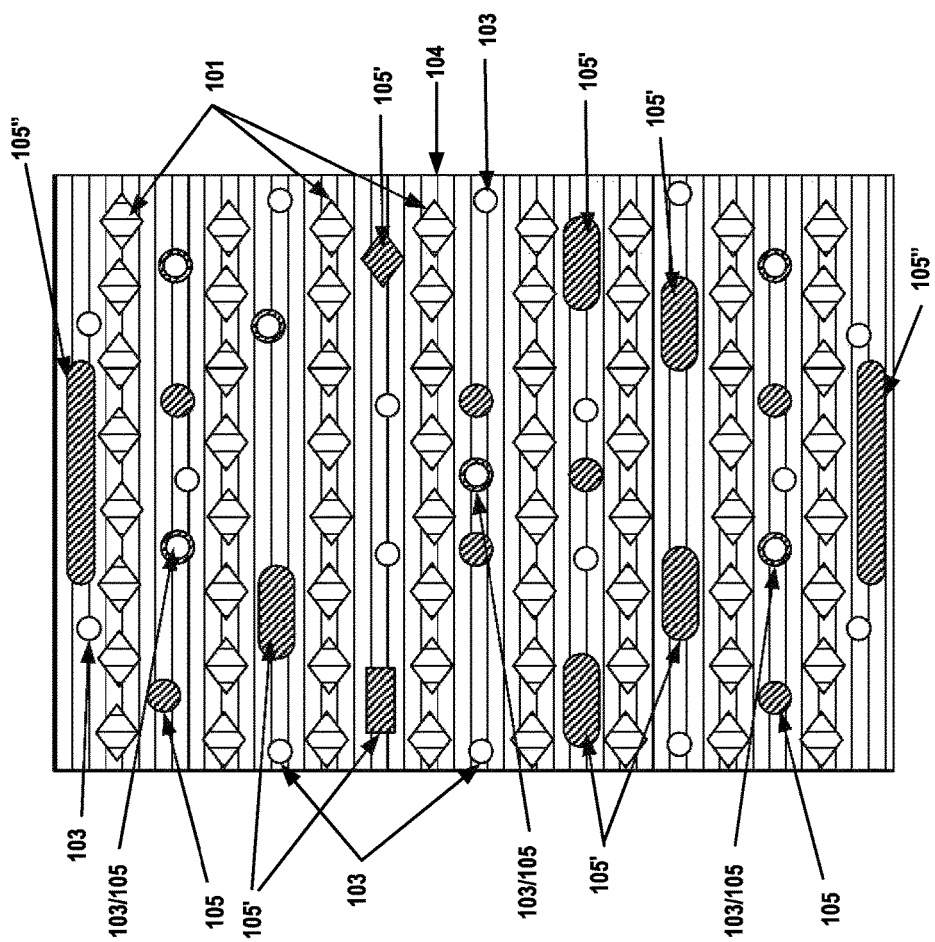
FIG. 10 is a top diagram of antenna lid in an embodiment of the invention.

In FIG. 10, an alternative embodiment of the invention shows that the adhesive pillars do not need to be circular, but other shapes such as ovals, squares and rectangles are possible. A mixture of shapes is used in alternative embodiments of the invention. The circular dots are a preferred embodiment as they are easier to dispense in a precise diameter than depositing other shapes, but it is not a requirement of the invention that the adhesive pillars be circular. Larger adhesive pillars can offset more tensile force so depending on the design, fewer can be used. The size of the adhesive pillars in the interior region should be small enough that they fit between the antenna elements without requiring redesign of the preferred antenna array. In this embodiments of the invention, the antenna array is uniform in the spacing of the elements, without requiring special locations for the stand-offs or pillars that would modify the spacing of the antenna elements. The size of the adhesive pillars at a peripheral region outside the antenna array can be larger, but it is an advantage of embodiments of the invention that a large peripheral region of the antenna package outside the antenna array is unneeded for bonding between substrates. In other words, the "peripheral region", i.e. the outermost set of pillars and stand-offs, is located inside the antenna array in some embodiments of the invention.

In an alternative embodiment of the invention, an adhesive all around the periphery of the package can be used to seal two substrates in the package. Adhesive pillars and copper stand-offs are used in interior positions of the antenna to alleviate compressive and tensile forces that would results in gap variation if not well controlled.

The present invention has many advantages over the prior art. The combination of copper ball stand-offs and adhesive pillars, precisely positioned between elements in the antenna array, assure air gap control as well as mechanical stability of the packaging solution. The stand-offs and pillars compensate for the compressive and tensile forces experienced by the package both during the assembly process and during the operating lifetime of the product. The copper (or other material) ball connections to the respective substrates are performed on a single substrate (to compensate for compressive forces) or to both substrates to also compensate for tensile forces after cure and assure controlled gap control at defined locations and assure mechanical stability. The controlled adhesive pillars are added at specific locations between antennas to control tensile forces. Composite structures are created where adhesive pillars are added at the same location as a copper ball, e.g., where both compressive and tensile forces are anticipated during the lifetime of the product. A preponderance of composite structures are used to limit the number of total structures. The number of copper ball stand-offs and adhesive pillars are preferably optimized to minimize their total number, reducing material costs and limiting any undesirable effects such as antenna interference while also maintain the structural integrity of the antenna package through its lifetime.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an antenna package comprising:
    providing a first and second antenna substrate, each antenna substrate with a respective array of antenna elements disposed on a respective first surface;
    placing a plurality of stand-off balls on the first surface of the first antenna substrate, a first sub-plurality of the stand-off balls placed at positions in a peripheral region of the first substrate and a second sub-plurality of the stand-off balls at interior positions between antenna elements;
    dispensing an adhesive on the first surface of one of the antenna substrates at a plurality of discrete selected locations, wherein a first location of the discrete selected locations is a peripheral region and a second location of the discrete selected locations is at interior positions between antenna elements; and
    joining the first antenna substrate to the second antenna substrate in a force capping process using an adhesive cure process, wherein the plurality of stand-off balls provide a plurality of controlled gap spacers and the dispensed adhesive forms a plurality of adhesive pillars joining the first and second antenna substrates.

2. The method as recited in claim 1, wherein the first antenna substrate is an antenna lid laminate substrate and the first second antenna substrate is an antenna carrier laminate substrate on which semiconductor chips are bonded on a second surface opposite to the first surface, wherein the plurality of stand-off balls and the plurality of adhesive pillars control an air gap between the first and second antenna substrates.

3. The method as recited in claim 1, and wherein the peripheral region is located outside the antenna array.

4. The method as recited in claim 1, wherein the adhesive is dispensed on the second substrate.

5. The method as recited in claim 1, wherein the adhesive is dispensed on the first substrate.

6. The method as recited in claim 1, wherein at least a subgroup of the plurality of stand-off balls is located where compressive forces are expected and at least subgroup of the adhesive pillars is located where tensile forces are expected.

7. The method as recited in claim 4, wherein a respective ball stand-off is located on the first substrate at a location corresponding to a respective discrete selected location so that a composite stand-off ball adhesive pillar is formed which joins the first and second substrates.

8. The method as recited in claim 1, wherein a minimum number of ball stand-offs and pillars are selected to reduce antenna interference and maintain structural integrity.

9. The method as recited in claim 1, wherein the respective arrays of antenna elements are uniform in spacing and all of the stand-off balls and adhesive pillars are located at positions between antenna elements.

10. The method as recited in claim 1, wherein the ball stand-offs are copper balls attached with solder only on the first surface of the first antenna substrate.

* * * * *